(12) United States Patent
Cheng

(10) Patent No.: US 9,016,946 B2
(45) Date of Patent: Apr. 28, 2015

(54) SLIDE PLATE HINGE FOR PORTABLE ELECTRONIC DEVICE TERMINAL

(75) Inventor: Guanlun Cheng, Hangzhou (CN)

(73) Assignee: Zhejiang University, Hangzhou, Zhejiang Province (CN)

( * ) Notice: Subject to any disclaimer, the term of this patent is extended or adjusted under 35 U.S.C. 154(b) by 0 days.

(21) Appl. No.: 14/232,259

(22) PCT Filed: Mar. 14, 2012

(86) PCT No.: PCT/CN2012/072313
§ 371 (c)(1),
(2), (4) Date: Jan. 11, 2014

(87) PCT Pub. No.: WO2013/007115
PCT Pub. Date: Jan. 17, 2013

(65) Prior Publication Data
US 2014/0133788 A1    May 15, 2014

(30) Foreign Application Priority Data
Jul. 11, 2011    (CN) .................. 2011 2 0242955 U

(51) Int. Cl.
| | |
|---|---|
| *F16C 29/02* | (2006.01) |
| *F16C 29/10* | (2006.01) |
| *H05K 5/02* | (2006.01) |
| *E05D 7/00* | (2006.01) |
| *B23Q 1/28* | (2006.01) |
| *F16C 29/00* | (2006.01) |

(Continued)

(52) U.S. Cl.
CPC ............... *H05K 5/0226* (2013.01); *B23Q 1/56* (2013.01); *F16C 29/005* (2013.01); *B23Q 1/26* (2013.01); *F16C 29/084* (2013.01); *B23Q 1/28* (2013.01); *H04M 1/0237* (2013.01); *E05D 7/00* (2013.01); *G06F 1/1624* (2013.01)

(58) Field of Classification Search
CPC . H04M 1/0237; H05K 5/0226; H05K 5/0239; H05K 7/1404; H04K 7/12; E05D 7/00
USPC .......... 384/7, 17, 20, 34, 35–37, 39; 455/575.1–575.4, 433.01, 433.03; 361/679.39, 679.01, 679.55, 727; 24/3.1; 163/364
See application file for complete search history.

(56) References Cited

U.S. PATENT DOCUMENTS 7,755,892 B2 *   7/2010   Wang et al. .............. 361/679.55
7,783,331 B2 *   8/2010   Chung et al. ............... 455/550.1
(Continued)

FOREIGN PATENT DOCUMENTS

CN    202127576 U  * 12/2010  .............. H04K 1/02
CN    201663629 U  *  1/2012  .............. H05M 5/03

*Primary Examiner* — Marcus Charles
(74) *Attorney, Agent, or Firm* — Han IP Corporation

(57) ABSTRACT

A slide plate hinge comprises a fixed plate, and a slide plate. A slide plate sliding guide groove is respectively arranged on each of both sides of the fixed plate. The central section of the groove wall at one side of the sliding guide groove is of an elastic structure, and the elastic structure and the groove wall at the other side of the sliding guide groove clamps the slide plate. The slide plate hinge can implement the sliding guide and friction clamping on the slide plate by use of the sliding guide groove of an elastic structure, with high structural integration and concealability, thereby enabling the slide plate hinge to still have good hand feeling even without driving springs and enabling the slide plate to be stopped at any time amid the sliding process. The driving springs are not indispensable, so the thickness of the hinge can be reduced.

13 Claims, 6 Drawing Sheets

(51) Int. Cl.
*H04M 1/02* (2006.01)
*G06F 1/16* (2006.01)
*B23Q 1/56* (2006.01)
*B23Q 1/26* (2006.01)
*F16C 29/08* (2006.01)

(56) References Cited

U.S. PATENT DOCUMENTS

| | | | |
|---|---|---|---|
| 7,953,464 B2 * | 5/2011 | Park et al. | 379/433.11 |
| 8,260,383 B2 * | 9/2012 | Yuan | 455/575.4 |
| 2001/0054217 A1 * | 12/2001 | Wang | 24/3.1 |
| 2004/0085739 A1 * | 5/2004 | Lee et al. | 361/727 |
| 2007/0060220 A1 * | 3/2007 | Hsu | 455/575.4 |
| 2008/0064455 A1 * | 3/2008 | Joo et al. | 455/575.4 |
| 2008/0090627 A1 * | 4/2008 | Jeong et al. | 455/575.4 |
| 2008/0132303 A1 * | 6/2008 | Naukkarinen et al. | 455/575.4 |
| 2009/0149228 A1 * | 6/2009 | Wang et al. | 455/575.4 |
| 2010/0134962 A1 * | 6/2010 | Wu | 384/10 |
| 2011/0195762 A1 * | 8/2011 | Noh et al. | 455/575.4 |
| 2012/0077555 A1 * | 3/2012 | Jung | 455/575.4 |

* cited by examiner

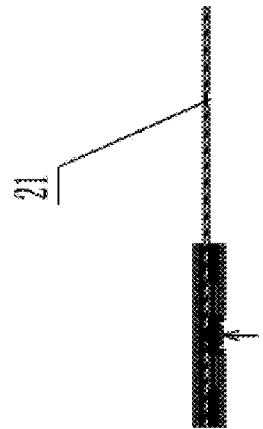
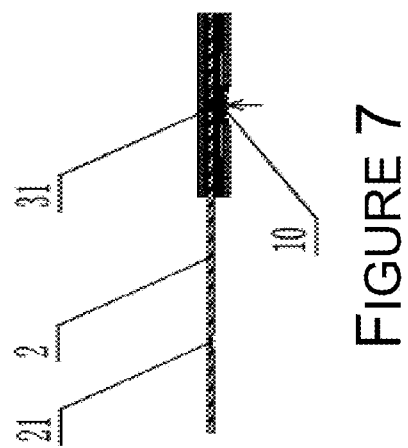
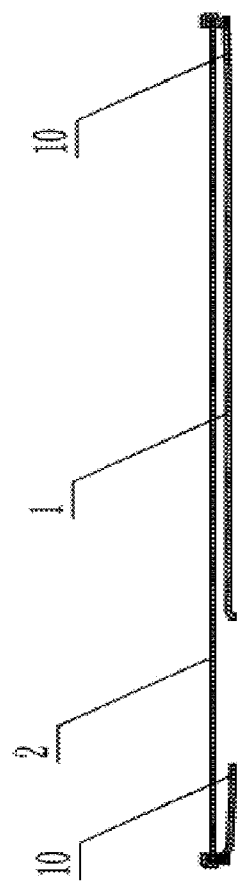

SLIDE PLATE HINGE FOR PORTABLE ELECTRONIC DEVICE TERMINAL

CROSS REFERENCE TO RELATED APPLICATIONS

This application is the U.S. national phase application of International application number PCT/CN2012/072313, filed on 14 Mar. 2012, which claims the priority benefit of China Patent Application No. 201120242955.X, filed on 11 Jul. 2011. The above-identified application is hereby incorporated by reference in their entirety.

TECHNICAL FIELD

The present disclosure relates to a slide plate hinge for portable electronic device terminal. The portable electronic device may include electronic products such as a mobile phone, a PHS (Personal Handphone System), an electronic dictionary, a laptop, an e-book and a handheld game player, etc.

BACKGROUND

A conventional slide plate hinge is a semiautomatic hinge with a driving spring. The slide plate hinge includes a fixed plate and a slide plate which are featured by relative sliding, and between which are connected with a driving mechanism facilitating relative sliding. The driving spring is used as the driving component of the driving mechanism. When an operator turns on or turns off a slide machine body, the driving spring is stretched, compressed or twisted and the like, thus accumulating energy. After the slide machine body is pushed past a critical point (in other words, after the spring is converted from accumulation of energy to release of energy), the slide machine body, driven by the spring, continues sliding, thus enabling a portable mobile electronic device to be turned on and off.

The spring plays a part in the driving mechanism. However, the spring is positioned between the fixed plate and the slide plate, taking up considerable space. This greatly restricts thickness-reduction design of the portable electronic device terminal. In addition, the portable electronic device terminal is unable to be stopped at will when the slide plate is turned on.

SUMMARY

The present disclosure aims at solving the aforementioned technical problem by providing a slide plate hinge for portable electronic device terminal, which is characterized in that the hinge thickness is reduced, and the slide plate is able to stop at any time amid the sliding process with good hand feeling. For this purpose, the present disclosure adopts a technical scheme as follows: the slide plate hinge comprises a fixed plate and a slide plate. A slide plate sliding guide groove is respectively arranged on each of two sides of the fixed plate. The central section of the groove wall on one side of the sliding guide groove is an elastic structure, and the elastic structure and the groove wall on the other side of the sliding guide groove clamps the slide plate.

On the basis of adopting the above-mentioned technical scheme, the present disclosure also can adopt a further technical scheme as follows: the fixed plate is provided with a spring or a spring strip configured to support the elastic structure.

The fixed plate is provided with a spring strip configured to support the elastic structure. The spring strip is formed by incising and bending on the fixed plate. Both sides of the fixed plate are bent to an installation slot open to the inside of the fixed plate. The sliding guide groove is arranged in the installation slot. The spring strip is positioned on the slot wall at the lower part of the installation slot, or the spring strip is from the slot wall at the lower part of the installation slot to the slot wall at the upper part of the installation slot through the bottom of the installation slot.

The elastic structure comprises: a friction block (in the middle of the elastic structure) protruding on the sliding path of the slide plate and moving up and down; and an elastic arm outstretched toward both sides of the friction block. A guide slope is respectively arranged on each of both sides of the friction block.

The elastic structure is connected to the sliding guide groove as an integrated structure. The groove bottom of the sliding guide groove is hollow at the segment corresponding to the elastic structure.

The outside of the friction block is provided with a first left-and-right limit structure, and the fixed plate is provided with a limit slot matched to the first left-and-right limit structure.

The outside of the groove bottom of the sliding guide groove is provided with a second left-and-right limit structure, and the fixed plate is provided with a limit slot matched to the second left-and-right limit structure.

A groove matched to the friction block is arranged on the slide plate relative to the limit position of the slide stroke.

By adopting the above-mentioned technical scheme in the invention, the slide plate hinge can implement the sliding guide and friction clamping on the slide plate by use of the sliding guide groove of an elastic structure, with high structural integration and concealability. This enables the slide plate hinge to still have good hand feeling even without driving springs and enabling the slide plate to be stopped at any time amid the sliding process. Moreover, the driving springs are not indispensable, so the thickness of the hinge can be reduced.

BRIEF DESCRIPTION OF THE DRAWINGS

FIG. 7 is a longitudinal section view of the hinge in Embodiment 1 when the end of travel is opened.

FIG. 8 is a longitudinal section view of the hinge in Embodiment 1 when the end of travel is closed.

FIG. 9 is a cross sectional view of Embodiment 1 in the present disclosure.

DETAILED DESCRIPTION OF THE PREFERRED EMBODIMENTS

Figure 1:
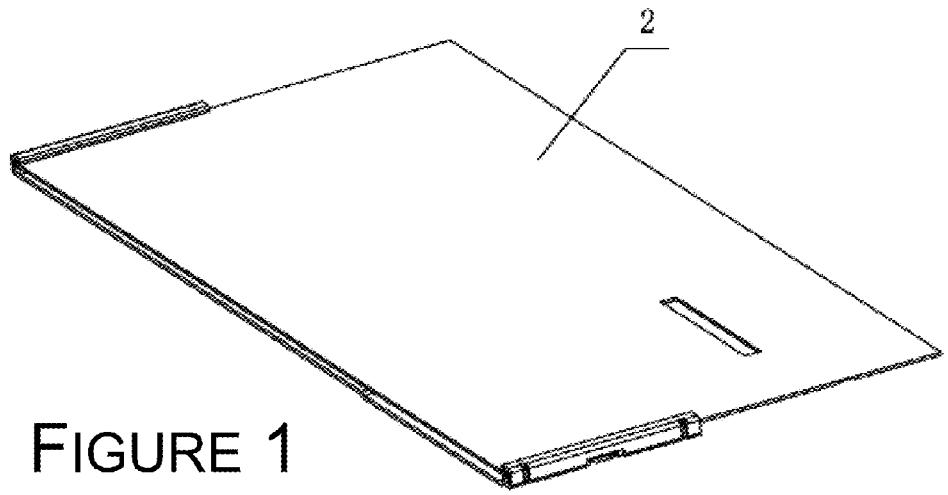
FIG. 1 is a front view of Embodiment 1 of the present disclosure.
Figure 2:
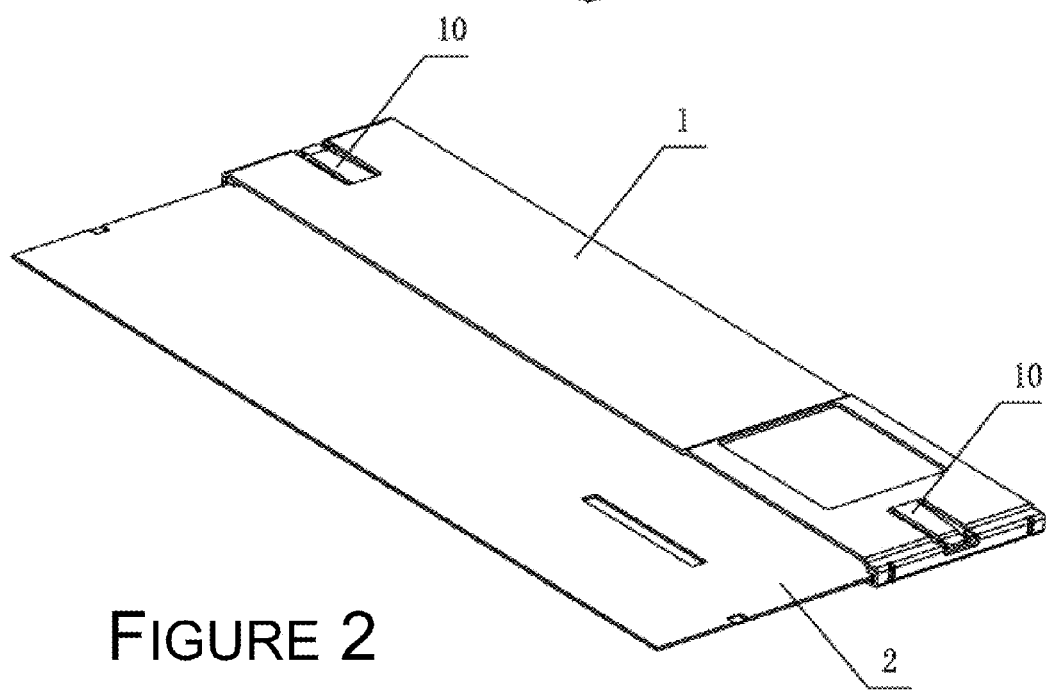
FIG. 2 is a back view of Embodiment 1 of the present disclosure.
Figure 3:
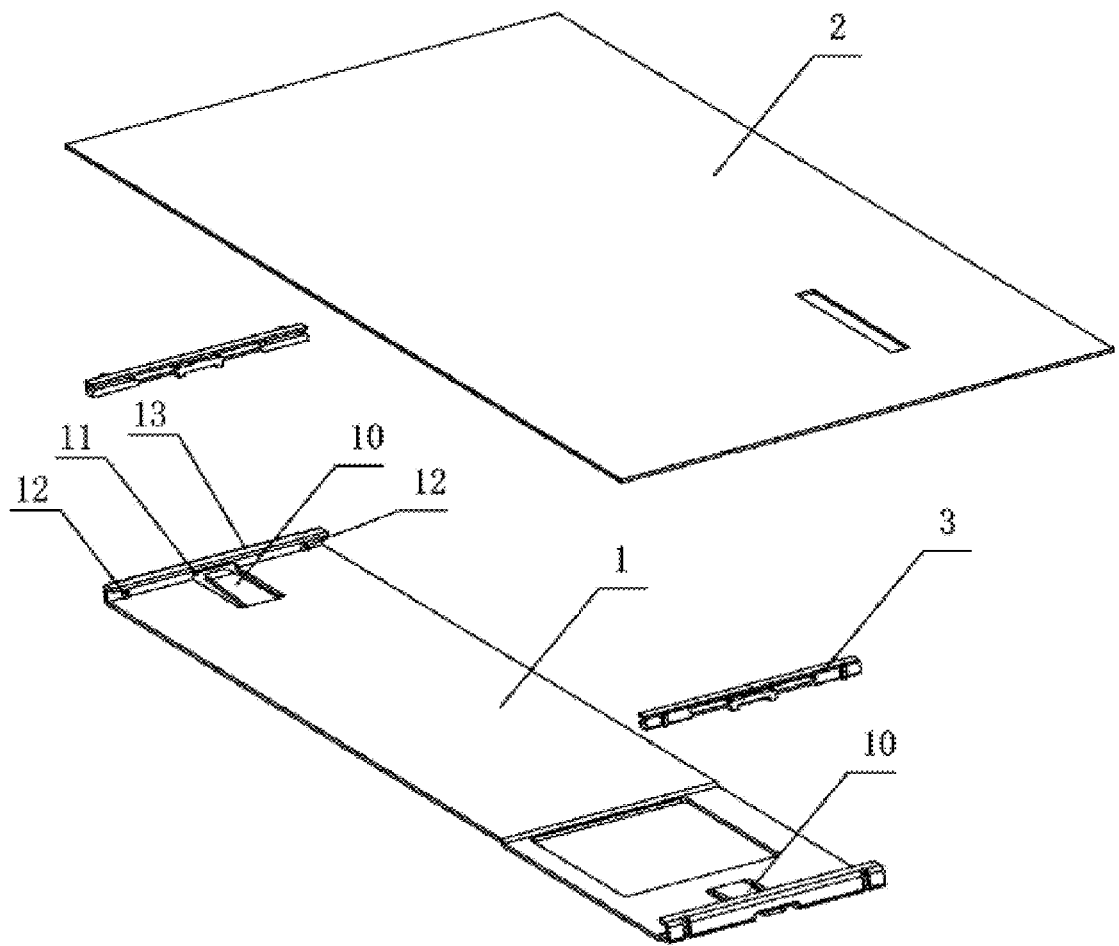
FIG. 3 is an explosive view of Embodiment 1 of the present disclosure.
Figure 4:
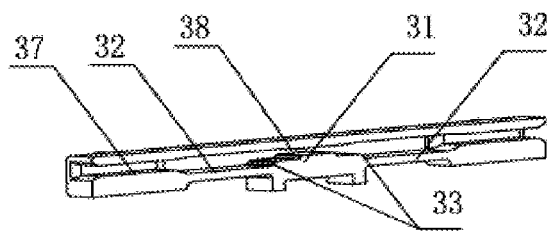
FIG. 4 is a front view of the sliding guide groove in Embodiment 1.
Figure 5:
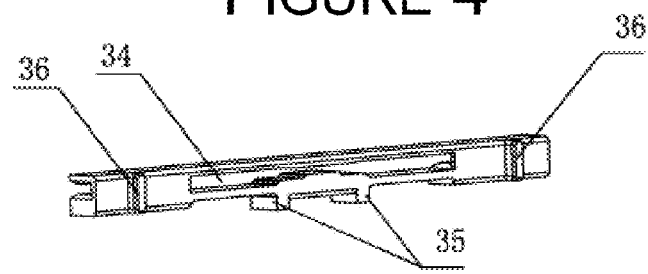
FIG. 5 is a back view of the sliding guide groove in Embodiment 1.
Figure 6:
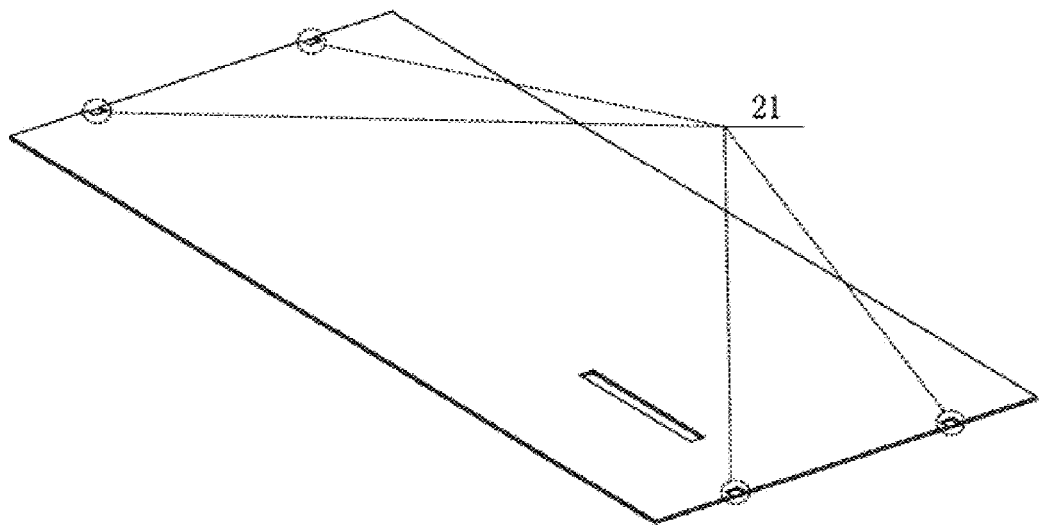
FIG. 6 is a back view of the slide plate in Embodiment 1.

As for Embodiment 1, please refer to FIGS. 1-9.

The present disclosure comprises a fixed plate 1 and a slide plate 2. Slide plate sliding guide grooves 3 are respectively arranged on each of both sides of the fixed plate 1. The central section of the groove wall 37 on one side of the sliding guide groove 3 is an elastic structure, and the elastic structure and the groove wall 38 on the other side of the sliding guide groove 3 clamps the slide plate 2.

The fixed plate 1 is provided with a spring or a spring strip configured to support the elastic structure. In one embodiment, it is a spring strip 10 (the direction of its elastic force is as shown in FIGS. 7-8). Further, the spring strip 10 is formed by incising and bending on the fixed plate 1. The spring strip can be an additional spring strip for punching, which is welded on the fixed plate 1 in assembly, or welded on the fixed plate 1 after inlay injection for producing frictional force on the slide plate 2.

Both sides of the fixed plate 1 are bent to an installation slot 13 open to the inside of the fixed plate 1. The sliding guide groove 3 is arranged in the installation slot 13, the spring strip 10 is positioned on the slot wall at the lower part of the installation slot 13. The groove wall 37, on one side of the sliding guide groove 3, is a groove wall at the lower side of the sliding guide groove 3.

The elastic structure comprises a friction block 31 (in the middle of the elastic structure) protruding on the sliding path of the slide plate 2 and moving up and down. The elastic structure further comprises elastic arm 32 outstretched toward both sides of the friction block. Guide slopes 33 are respectively arranged on both sides of the friction block 31. The elastic structure is connected to the sliding guide groove 3 as an integrated structure. A metal reinforcing body can be inlayed and molded on the elastic structure. The groove bottom 34 of the sliding guide groove 3 is hollow at the segment corresponding to the elastic structure. The elastic structure also can be a separate component detachable from the sliding guide groove body, and is connected to the sliding guide groove 3. The elastic structure can be made from materials different from the sliding guide groove body. For example, the elastic structure may be a spring strip.

The outside of the friction block 31 is provided with a first left-and-right limit structure 35, and the fixed plate 1 is provided with a limit slot 11 matched to the first left-and-right limit structure 35. The outside of the groove bottom of the sliding guide groove 3 is provided with a second left-and-right limit structure 36, and the fixed plate 1 is provided with a limit slot 12 matched to the second left-and-right limit structure 36. Both or either of the above limit structures can be selected for the purpose of preventing the sliding guide groove 3 from loosening and protecting the weaker part in the elastic structure.

The limit position of the slide stroke relative to the slide plate 2 is provided with a groove 21 fitting with the friction block 31. The groove 21 is matched to the friction block 31, which provides the hinge with a locking and fixing function. When sliding to the end, the slide plate 2 is snapped, locked and fixed.

In one embodiment, the spring strip 10 is cocked vertically upward and is applied to the bottom of the friction block 31, compressing the space between the upper structure and the lower structure of the sliding guide groove 3, thus transmitting elastic force of the spring strip 10 to the slide plate 2 and forming positive pressure on the slide plate 2. When the slide plate 2 is sliding relative to the sliding guide groove 3, certain friction force is formed between the slide plate 2 and the friction block 31. An equilibrium force system is formed by the friction force and external force exerted on the slide plate 2, thus realizing the function of stopping at discretion and good hand feeling.

Figure 10:
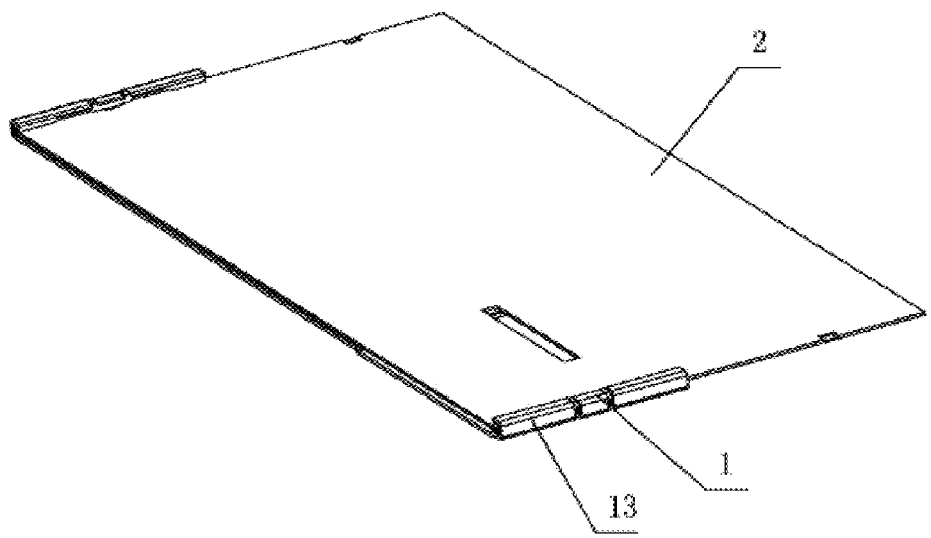
FIG. 10 is a schematic view of Embodiment 2 in the present disclosure observed from one direction.
Figure 11:
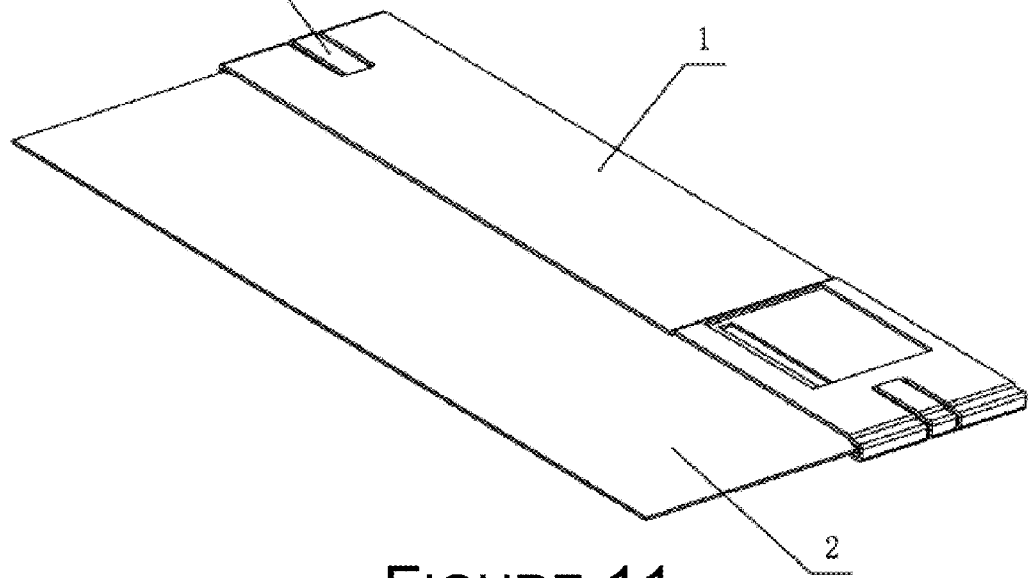
FIG. 11 is a schematic view of Embodiment 2 in the present disclosure observed from another direction.
Figure 12:
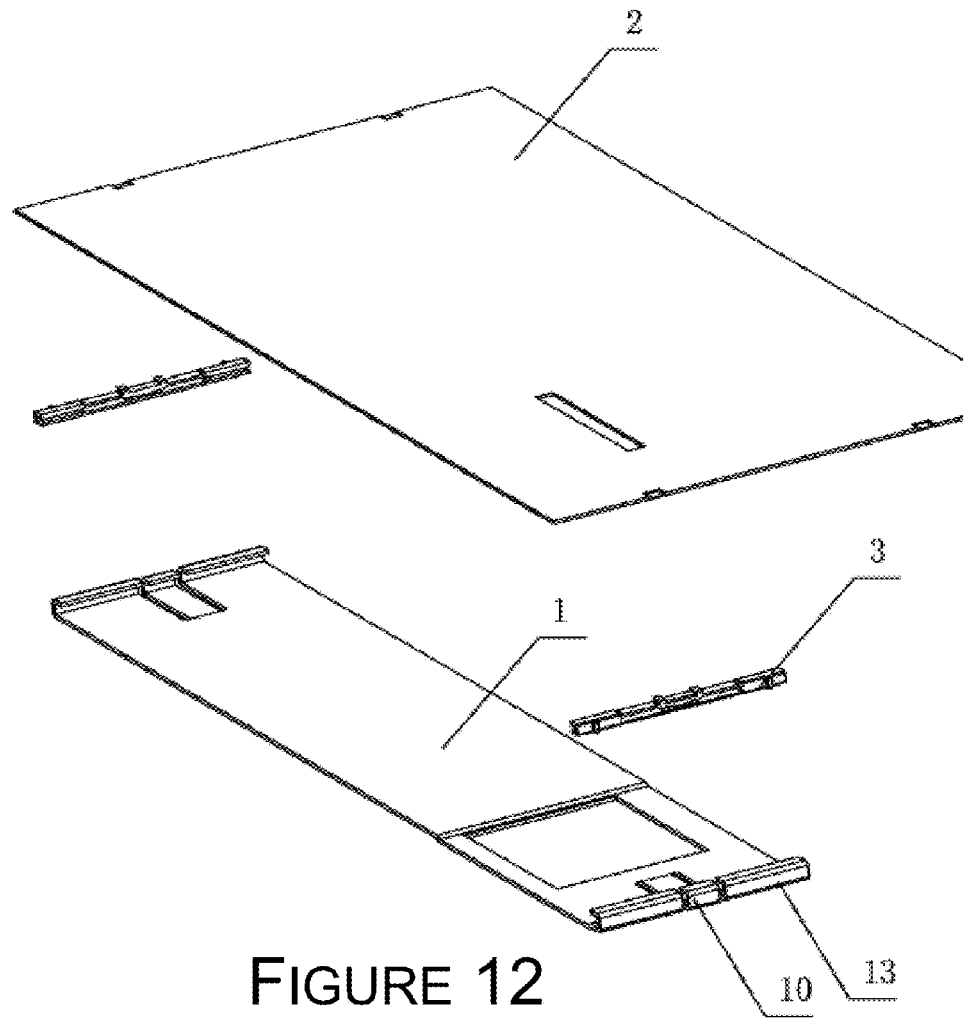
FIG. 12 is an explosive view of Embodiment 2 in the present disclosure.
Figure 13:
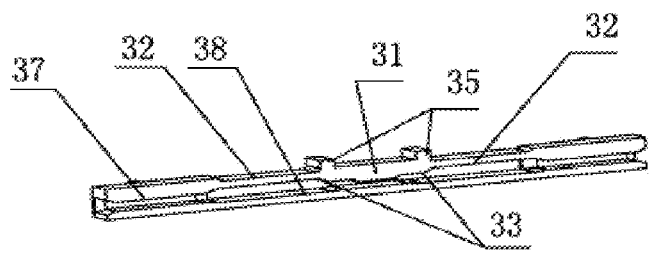
FIG. 13 is a front view of the sliding guide groove in Embodiment 2 in the present disclosure.

As for Embodiment 2, please refer to FIGS. 10-13.

In one embodiment, the spring strip 10 is from the slot wall at the lower part of the installation slot to the slot wall at the upper part of the installation slot through the bottom of the installation slot. The direction of elastic force of the elastic strip is vertically downward. Correspondingly, the elastic structure of the sliding guide groove 3 is interchanged with that in Embodiment 1. In this way, the elastic force of the elastic strip is exerted vertically downward on the friction block 31, which is more conducive to thickness-reduction design of the hinge. The present embodiment is the same as Embodiment 1 in terms of other structures. In FIGS. 10-13, the same numeral references as those used in FIGS. 1-9 are used for identical components.

What is claimed is:

1. A slide plate hinge for portable electronic device terminal, comprising:
   a fixed plate; and
   a slide plate, wherein:
   a slide plate sliding guide groove is respectively arranged on each of both sides of the fixed plate,
   a central section of a groove wall on one side of the sliding guide groove is of an elastic structure, and
   the elastic structure and the groove wall on another side of the sliding guide groove clamps the slide plate, wherein:
      the fixed plate is provided with a spring or a spring strip configured to support the elastic structure,
      the elastic structure comprises:
         a friction block, in a middle portion of the elastic structure, protruding on a sliding path of the slide plate and moving up and down, and
         an elastic arm outstretched toward both sides of the friction block, and
      a guide slope is respectively arranged on each of both sides of the friction block.

2. The slide plate hinge for portable electronic device terminal of claim 1, wherein the fixed plate is provided with a spring strip configured to support the elastic structure, and wherein the spring strip is formed by incising and bending on the fixed plate.

3. The slide plate hinge for portable electronic device terminal of claim 2, wherein both sides of the fixed plate are bent to an installation slot open to an inside of the fixed plate, wherein the sliding guide groove is arranged in the installation slot, and wherein the spring strip is positioned on a slot wall at a lower part of the installation slot.

4. The slide plate hinge for portable electronic device terminal of claim 2, wherein both sides of the fixed plate are bent to an installation slot open to an inside of the fixed plate, wherein the sliding guide groove is arranged in the installation slot, and wherein the spring strip is from a slot wall at a lower part of the installation slot to the slot wall at an upper part of the installation slot through a bottom of the installation slot.

5. The slide plate hinge for portable electronic device terminal of claim 2, wherein the elastic structure comprises a friction block, in a middle portion of the elastic structure, protruding on a sliding path of the slide plate and moving up and down, wherein the elastic structure further comprises an elastic arm outstretched toward both sides of the friction block, and wherein a guide slope is respectively arranged on each of both sides of the friction block.

6. The slide plate hinge for portable electronic device terminal of claim 5, wherein the elastic structure is connected to the sliding guide groove as an integrated structure, and wherein a groove bottom of the sliding guide groove is hollow at a segment corresponding to the elastic structure.

7. The slide plate hinge for portable electronic device terminal of claim 5, wherein an outside of the friction block is provided with a first left-and-right limit structure, and wherein the fixed plate is provided with a limit slot matched to the first left-and-right limit structure.

8. The slide plate hinge for portable electronic device terminal of claim 5, wherein a groove matched to the friction block is arranged on the slide plate relative to a limit position of a slide stroke.

9. The slide plate hinge for portable electronic device terminal of claim 1, wherein the elastic structure is connected to the sliding guide groove as an integrated structure, and wherein a groove bottom of the sliding guide groove is hollow at a segment corresponding to the elastic structure.

10. The slide plate hinge for portable electronic device terminal of claim 1, wherein an outside of the friction block is provided with a first left-and-right limit structure, and wherein the fixed plate is provided with a limit slot matched to the first left-and-right limit structure.

11. The slide plate hinge for portable electronic device terminal of claim 1, wherein an outside of a groove bottom of the sliding guide groove is provided with a second left-and-right limit structure, and wherein the fixed plate is provided with a limit slot matched to the second left-and-right limit structure.

12. The slide plate hinge for portable electronic device terminal of claim 1, wherein a groove matched to the friction block is arranged on the slide plate relative to a limit position of a slide stroke.

13. A slide plate hinge for portable electronic device terminal, comprising:
   a fixed plate; and
   a slide plate, wherein:
   a slide plate sliding guide groove is respectively arranged on each of both sides of the fixed plate,
   a central section of a groove wall on one side of the sliding guide groove is of an elastic structure, and
   the elastic structure and the groove wall on another side of the sliding guide groove clamps the slide plate, wherein:
      the fixed plate is provided with a spring strip configured to support the elastic structure,
      the spring strip is formed by incising and bending on the fixed plate,
      the elastic structure comprises a friction block, in a middle portion of the elastic structure, protruding on a sliding path of the slide plate and moving up and down,
      the elastic structure further comprises an elastic arm outstretched toward both sides of the friction block, and
      a guide slope is respectively arranged on each of both sides of the friction block.

\* \* \* \* \*

UNITED STATES PATENT AND TRADEMARK OFFICE
CERTIFICATE OF CORRECTION

PATENT NO. : 9,016,946 B2  
APPLICATION NO. : 14/232259  
DATED : April 28, 2015  
INVENTOR(S) : Guanlun Cheng Page 1 of 1

It is certified that error appears in the above-identified patent and that said Letters Patent is hereby corrected as shown below:

On the title page item (73),

The correct Assignee should read:

HANGZHOU AMPHENOL PHOENIX TELECOM PARTS CO., LTD.  
HANGZHOU, ZHEJIANG (CN)

Signed and Sealed this
Fifteenth Day of December, 2015

Michelle K. Lee  
*Director of the United States Patent and Trademark Office*